(12) United States Patent
Barsukou

(10) Patent No.: US 12,351,450 B2
(45) Date of Patent: Jul. 8, 2025

(54) DUAL MEMBRANE PIEZOELECTRIC MICROELECTROMECHANICAL SYSTEM MICROPHONE

(71) Applicant: SKYWORKS SOLUTIONS, INC., Irvine, CA (US)

(72) Inventor: Siarhei Dmitrievich Barsukou, Takarazuka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 487 days.

(21) Appl. No.: 17/659,030

(22) Filed: Apr. 13, 2022

(65) Prior Publication Data

US 2022/0332568 A1    Oct. 20, 2022

Related U.S. Application Data

(60) Provisional application No. 63/176,615, filed on Apr. 19, 2021.

(51) Int. Cl.
| | |
|---|---|
| *H01L 41/09* | (2006.01) |
| *B81B 3/00* | (2006.01) |
| *H01L 41/053* | (2006.01) |
| *H04R 17/02* | (2006.01) |
| *H10N 30/20* | (2023.01) |

(52) U.S. Cl.
CPC ........... *B81B 3/0021* (2013.01); *H04R 17/02* (2013.01); *H10N 30/2047* (2023.02); *B81B 2201/0257* (2013.01); *H04R 2201/003* (2013.01)

(58) Field of Classification Search
CPC .. H04R 2201/003; H04R 19/04; H04R 17/00; H01L 2924/1461; B81B 2203/0127; B81B 2201/0257
See application file for complete search history.

(56) References Cited

U.S. PATENT DOCUMENTS

| | | |
|---|---|---|
| 9,055,372 B2 | 6/2015 | Grosh et al. |
| 10,626,007 B2 | 4/2020 | Bretthauer et al. |
| 10,964,880 B2 | 3/2021 | Grosh et al. |

(Continued)

FOREIGN PATENT DOCUMENTS

| | | |
|---|---|---|
| EP | 3557881 A1 | 10/2019 |
| JP | 2008118639 A | 5/2008 |
| JP | 2019140638 A | 8/2019 |

OTHER PUBLICATIONS

Je et al., "MEMS Capacitive Microphone with Dual-Anchored Membrane", Proceedings 2017, 1, 342; Aug. 9, 2017.

(Continued)

*Primary Examiner* — Kyoung Lee
*Assistant Examiner* — David J Goodwin
(74) *Attorney, Agent, or Firm* — Lando & Anastasi, LLP

(57) ABSTRACT

A piezoelectric microelectromechanical system microphone comprises a piezoelectric element configured to deform and generate an electrical potential responsive to impingement of sound waves on the piezoelectric microelectromechanical system microphone, a sensing electrode disposed on the piezoelectric element and configured to sense the electrical potential, and a passive membrane mechanically coupled to the surface of the piezoelectric element to increase sensitivity of the piezoelectric microelectromechanical system microphone.

17 Claims, 18 Drawing Sheets

(56) References Cited

U.S. PATENT DOCUMENTS

| | | |
|---|---|---|
| 2008/0123878 A1 | 5/2008 | Zhe et al. |
| 2009/0092273 A1 | 4/2009 | Zhe et al. |
| 2011/0051985 A1* | 3/2011 | Hwang .................. H04R 17/00 |
| | | 381/396 |
| 2013/0121509 A1 | 5/2013 | Hsu et al. |
| 2016/0219374 A1* | 7/2016 | Hall ....................... H04R 17/02 |
| 2016/0219375 A1 | 7/2016 | Hall et al. |
| 2017/0085994 A1* | 3/2017 | Clerici .................. H04R 23/02 |
| 2017/0186940 A1* | 6/2017 | Bevilacqua ............ H10N 30/06 |
| 2018/0091905 A1 | 3/2018 | Clerici et al. |
| 2019/0281393 A1 | 9/2019 | Grosh et al. |
| 2019/0327562 A1* | 10/2019 | Cerini .................... H04R 17/02 |
| 2020/0148532 A1 | 5/2020 | Grosh et al. |
| 2020/0351595 A1 | 11/2020 | Rusconi Clerici Beltrami et al. |
| 2020/0382876 A1 | 12/2020 | Cerini et al. |
| 2021/0051413 A1 | 2/2021 | Hui et al. |
| 2021/0084423 A1 | 3/2021 | Rusconi Clerici Beltrami et al. |
| 2021/0120346 A1 | 4/2021 | Hui et al. |
| 2021/0136483 A1 | 5/2021 | Hsieh et al. |
| 2021/0385584 A1 | 12/2021 | Goswami et al. |
| 2022/0073342 A1 | 3/2022 | Ho et al. |
| 2022/0267141 A1 | 8/2022 | Chen et al. |
| 2022/0272459 A1 | 8/2022 | Chen et al. |
| 2022/0402752 A1 | 12/2022 | Goswami et al. |
| 2023/0007405 A1 | 1/2023 | Qian et al. |
| 2023/0011561 A1 | 1/2023 | Qian et al. |
| 2023/0012046 A1 | 1/2023 | Qian et al. |
| 2023/0039743 A1 | 2/2023 | Hui et al. |
| 2023/0072672 A1 | 3/2023 | Chen et al. |
| 2023/0104257 A1 | 4/2023 | Barsukou et al. |
| 2023/0105699 A1 | 4/2023 | Chen et al. |
| 2023/0127983 A1 | 4/2023 | Chen et al. |
| 2023/0188896 A1 | 6/2023 | Barsukou |
| 2023/0234837 A1 | 7/2023 | Chen et al. |
| 2023/0239641 A1 | 7/2023 | Chen et al. |
| 2023/0303387 A1 | 9/2023 | Barsukou |
| 2024/0098426 A1 | 3/2024 | Barsukou |

OTHER PUBLICATIONS

Lo et al., "Development of a No. Back-Plate SOI MEMS Condenser Microphone", 2015 IEEE, Transducers 2015, Anchorage, Alaska, USA, Jun. 21-25, 2015.

Lo et al., "Sensitivity Improvement of a No-Back-Plate MEMS Microphone Using Polysilicon Trench-Refilled Process", 2017 IEEE, Transducers 2017, Kaohsiung, Taiwan, Jun. 18-22, 2017.

Shah et al., "Design Approaches of MEMS Microphones for Enhanced Performance", Hindawi, Journal of Sensors, vol. 2019, Article ID 9294528, 26 pages.

Combined Search and Examination Report from corresponding United Kingdom Application No. 2205712.9 dated Oct. 17, 2022.

Chen et al. "Acoustic Transducers Built on Edge-released MEMS Structures," Solid-State Sensors, Actuators, and Microsystems Workshop Hilton Head Island, South Carolina, Jun. 6-10, 2010, pp. 234-237.

Chen et al., "Edge-released, piezoelectric MEMS acoustic transducers in array configuration," J. Micromech. Microeng. 22 (2012) 025005, pp. 1-9.

Huang et al., "High Sensitivity and High S/N Microphone Achieved by PZT Film with Central-Circle Electrode Design", IEEE, MEMS 2017, Las Vegas, NV, USA, Jan. 22-26, 2017, pp. 1188-1191.

Je et al., "In situ tuning of a MEMS microphone using electrodeposited nanostructures," Journal of Micromechanics and Microengineering, 19 (2009) 035015, pp. 1-8.

Knisely et al., "Method for Controlling Stress Gradients in PVD Aluminum Nitride", Journal of Micromechanics and Microengineering, vol. 28, No. 11, 2018.

Littrell, "High Performance Piezoelectric MEMS Microphones", A dissertation submitted in partial fulfillment of the requirements for the degree of Doctor of Philosophy (Mechanical Engineering) in The University of Michigan, 2010, 111 pages.

Mohamad et al., "Modelling and Optimisation of a Spring-Supported Diaphragm Capacitive MEMS Microphone", Engineering, 2010, 2, 762-770.

Peña-García et al., "Design and Modeling of a MEMS Dual-Backplate Capacitive Microphone with Spring-Supported Diaphragm for Mobile Device Applications," Sensors (2018), 18, 3545, 30 pages.

Pulskamp et al. "Mitigation of residual film stress deformation in multilayer microelectromechanical systems cantilever devices." Journal of Vacuum Science & Technology B: Microelectronics and Nanometer Structures Processing, Measurement, and Phenomena 21.6 (2003): 2482-2486.

Segovia-Fernandez et al., "Monolithic Piezoelectric Aluminum Nitride MEMS-CMOS Microphone", IEEE (2017), Transducers 2017, Kaohsiung, Taiwan, Jun. 18-22, 2017, pp. 414-417.

Udvardi et al., Spiral-Shaped Piezoelectric MEMS Cantilever Array for Fully Implantable Hearing Systems. Micromachines (2017) 8, 311, 13 pages.

Williams et al., "An AlN MEMS Piezoelectric Microphone for Aeroacoustics Applications", Journal of Microelectromechanical Systems, vol. 21, No. 2, Apr. 2012, pp. 270-283.

Yamashita et al., "Diaphragm deflection control of piezoelectric ultrasonic microsensors for sensitivity improvement", Sensors and Actuators A 139 (2007), pp. 118-123.

Yan et al., "Corrugated Diaphragm for Piezoelectric Microphone", IEEE, 1996, pp. 503-506.

Search and Examination Report from corresponding Singaporean Application No. 10202204071X dated Oct. 24, 2024.

Combined Search and Examination Report from United Kingdom Application No. 2410678.3 dated Aug. 29, 2024.

Office Action from United Kingdom Application No. 2317497.2 dated Aug. 5, 2024.

* cited by examiner

OR

OR

OR

OR

DUAL MEMBRANE PIEZOELECTRIC MICROELECTROMECHANICAL SYSTEM MICROPHONE

CROSS-REFERENCE TO RELATED APPLICATIONS

This application claims priority under 35 U.S.C. § 119(e) to U.S. Provisional Patent Application Ser. No. 63/176,615, titled "DUAL MEMBRANE PIEZOELECTRIC MICRO-ELECTROMECHANICAL SYSTEM MICROPHONE," filed Apr. 19, 2021, the entire contents of which is incorporated by reference herein for all purposes.

BACKGROUND

Technical Field

Embodiments disclosed herein relate to piezoelectric microelectromechanical system microphones and to devices including same.

Description of Related Technology

A microelectromechanical system (MEMS) microphone is a micro-machined electromechanical device to convert sound pressure (e.g., voice) into an electrical signal (e.g., voltage). MEMS microphones are widely used in mobile devices such as cellular telephones, headsets, smart speakers, and other voice-interface devices/systems. Capacitive MEMS microphones and piezoelectric MEMS microphones (PMMs) are both available in the market. PMMs requires no bias voltage for operation, therefore, they provide lower power consumption than capacitive MEMS microphones. The single membrane structure of PMMs enable them to generally provide more reliable performance than capacitive MEMS microphones in harsh environments. Existing PMMs are typically based on either diaphragm MEMS structures or cantilever MEMS structures.

SUMMARY

In accordance with one aspect, there is provided a piezoelectric microelectromechanical system microphone. The piezoelectric microelectromechanical system microphone comprises a piezoelectric element configured to deform and generate an electrical potential responsive to impingement of sound waves on the piezoelectric microelectromechanical system microphone, a sensing electrode disposed on the piezoelectric element and configured to sense the electrical potential, and a passive membrane mechanically coupled to the surface of the piezoelectric element to increase sensitivity of the piezoelectric microelectromechanical system microphone.

In some embodiments, the passive membrane is mechanically coupled to the surface of the piezoelectric element by a column having a cross-sectional area that is less than a surface area of the piezoelectric element and less than a surface area of the passive membrane.

In some embodiments, the column has a length less than a distance by which a center of the piezoelectric element is displaced when exposed to a maximum sound pressure for which the piezoelectric microelectromechanical system microphone is rated.

In some embodiments, the piezoelectric element is mechanically secured to a supporting substrate including an acoustic port and the passive membrane is mechanically secured to the supporting substrate between the piezoelectric element and the acoustic port.

In some embodiments, the piezoelectric microelectromechanical system microphone further comprises one or more vent apertures defined in a support mechanically securing the passive membrane to the supporting substrate.

In some embodiments, the membrane is mechanically secured to the supporting substrate with a micromechanical spring.

In some embodiments, the passive membrane is mechanically secured to the supporting substrate with a material having a greater compliance than a material of which the passive membrane is formed.

In some embodiments, the passive membrane has a surface area that is less than a surface area of the piezoelectric element.

In some embodiments, the passive membrane has a surface area that is about the same as a surface area of the piezoelectric element.

In some embodiments, the passive membrane has a surface area that is greater than a surface area of the piezoelectric element.

In some embodiments, the passive membrane is mechanically secured to the supporting substrate in an enlarged diameter region of the supporting substrate.

In some embodiments, the piezoelectric element has a diaphragm structure clamped to a supporting substrate about its perimeter.

In some embodiments, the passive membrane is mechanically coupled to the surface of the piezoelectric element by a column extending from a center of a surface of the passive membrane to a center of the surface of the piezoelectric element.

In some embodiments, the sensing electrode includes both inner electrode regions proximate a center region of the piezoelectric element and outer electrodes proximate the perimeter of the piezoelectric element.

In some embodiments, the sensing electrode includes inner electrode regions proximate a center region of the piezoelectric element but lacks outer electrodes proximate the perimeter of the piezoelectric element.

In some embodiments, the piezoelectric element includes an upper film of piezoelectric material and a lower film of piezoelectric material, an upper sensing electrode disposed on an upper surface of the upper film, a lower sensing electrode disposed on a lower surface of the lower film, and a middle sensing electrode disposed between the upper film and lower film.

In some embodiments, the piezoelectric element has a cantilever structure including a plurality of cantilevers, each of the plurality of cantilevers having a base clamped to a supporting substrate, and a tip that is free to be displaced vertically responsive to impingement of sound waves on the piezoelectric microelectromechanical system microphone.

In some embodiments, the passive membrane is mechanically coupled to the piezoelectric element by columns extending from a surface of the passive membrane to respective regions proximate the tips of each of the plurality of cantilevers.

In some embodiments, the columns have a combined cross-sectional area that is less than a surface area of the piezoelectric element and less than a surface area of the passive membrane.

In some embodiments, the piezoelectric element includes an upper film of piezoelectric material and a lower film of piezoelectric material, an upper sensing electrode disposed on an upper surface of the upper film, a lower sensing electrode disposed on a lower surface of the lower film, and a middle sensing electrode disposed between the upper film and lower film.

In some embodiments, the piezoelectric microelectromechanical system microphone further comprises one or more vent apertures defined in the passive membrane.

In some embodiments, the piezoelectric microelectromechanical system microphone is included in an electronic device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
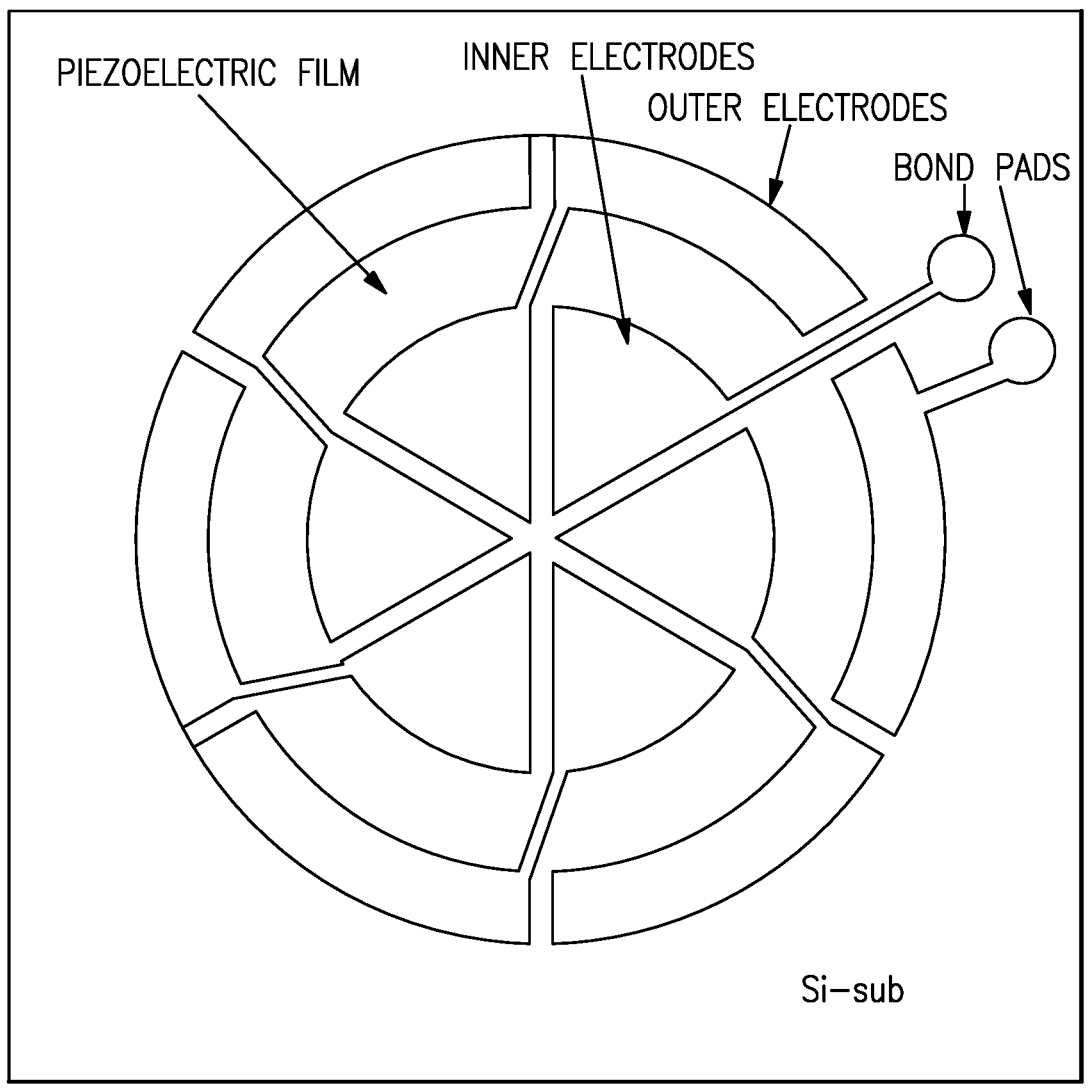
FIG. 1A is a plan view of a diaphragm type piezoelectric MEMS microphone.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1B:
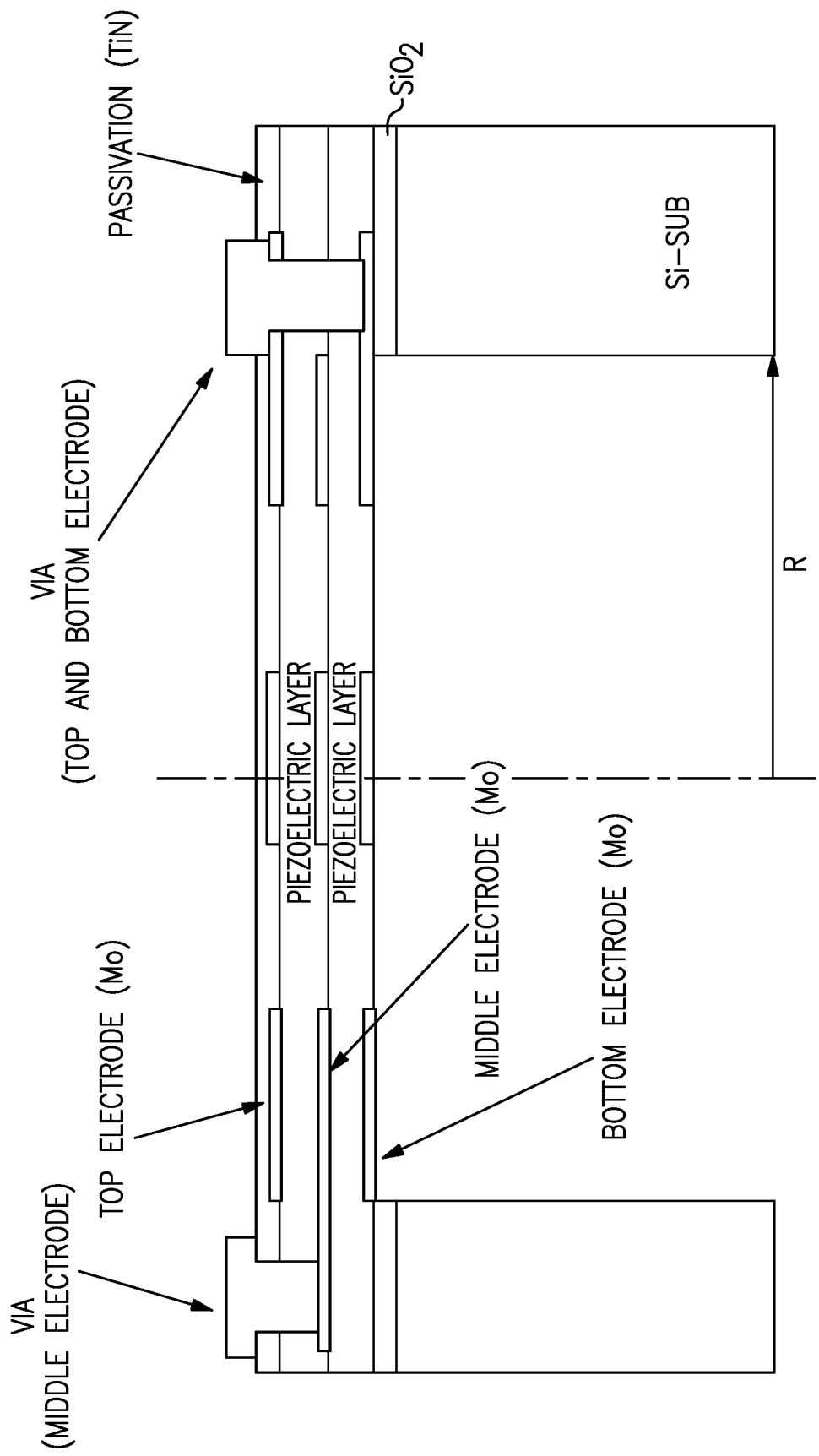
FIG. 1B is a cross sectional view of a diaphragm type piezoelectric MEMS microphone.

Microelectromechanical system (MEMS) microphones are typically produced using techniques similar to those for fabricating semiconductor devices on semiconductor wafers. One form of piezoelectric MEMS microphone (PMM) is a diaphragm structure PMM. As illustrated in FIG. 1A, a diaphragm structure PMM typically includes a piezoelectric element in the form of a membrane or film, often circular in shape, formed of a piezoelectric material such as aluminum nitride (AlN). The piezoelectric membrane is suspended over a cavity in a support substrate formed of, for example, silicon. Electrodes, typically including inner and outer electrodes, are disposed on the piezoelectric film to capture changes in voltage across the piezoelectric film as it is deformed responsive to exposure to sound waves. As illustrated in FIG. 1B, the piezoelectric film may include two layers of piezoelectric material, with inner and outer electrodes disposed on top of the upper film layer, between the upper and lower film layer, and on the bottom of the lower film layer. The different electrodes may be electrically connected in series to produce an output voltage responsive to deformation of the piezoelectric material film stack due to impact of sound waves.

Figure 2A:
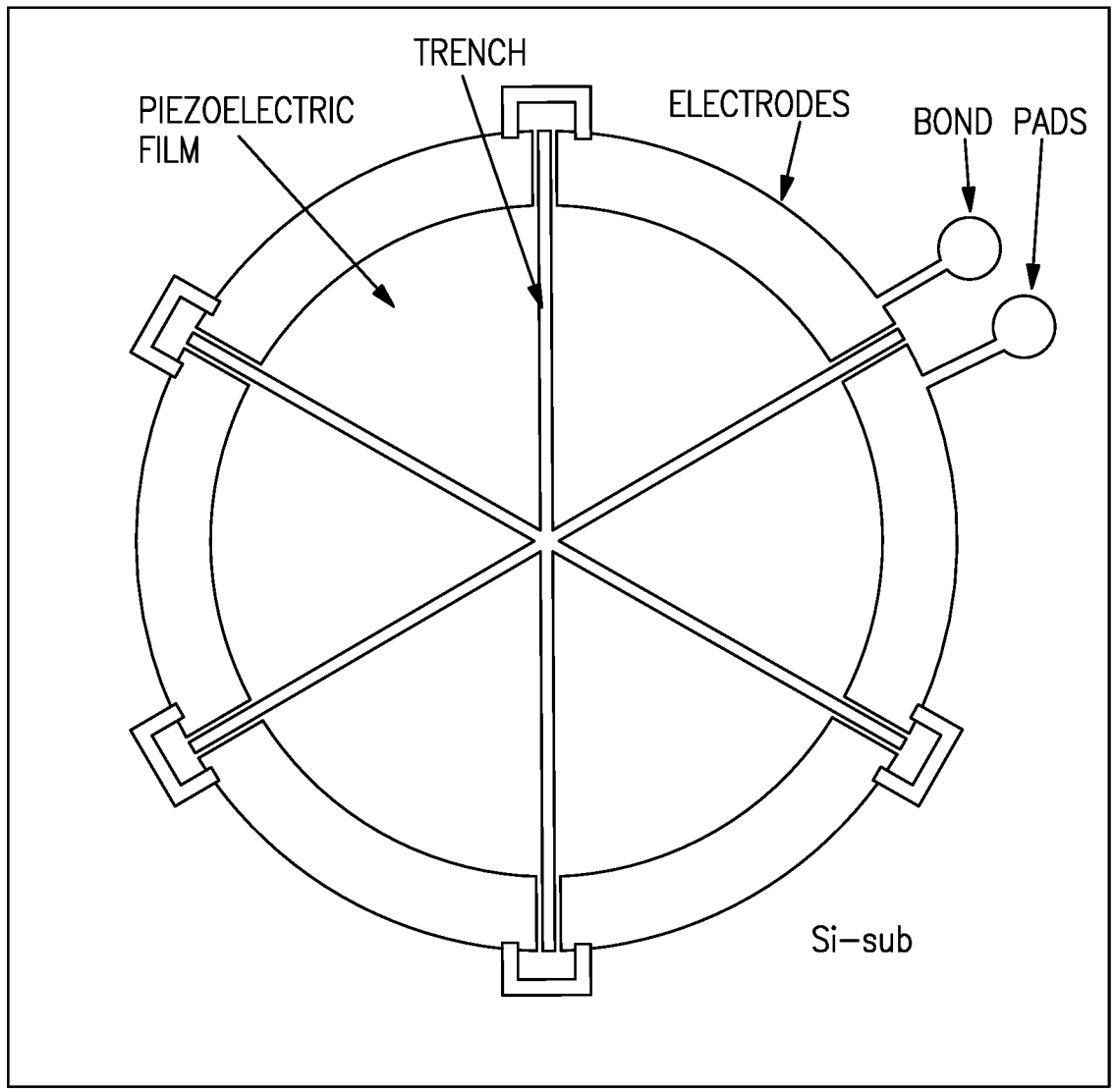
FIG. 2A is a plan view of a cantilever type piezoelectric MEMS microphone.
Figure 2B:
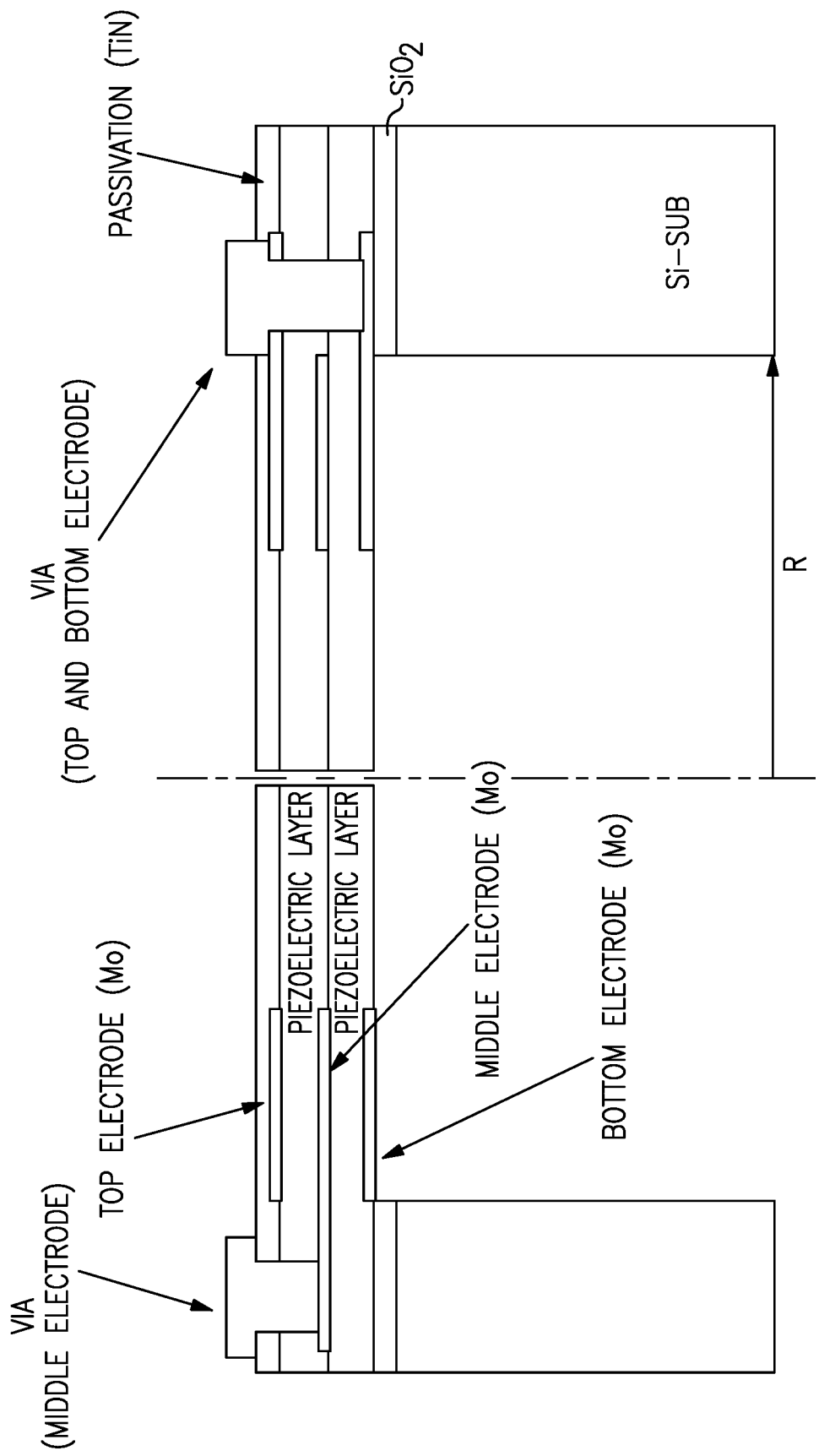
FIG. 2B is a cross sectional view of a cantilever type piezoelectric MEMS microphone.

Another form of MEMS microphone is a cantilever type PMM. A cantilever type PMM may include a piezoelectric element including one or more cantilevers formed of a piezoelectric material, for example, AlN, and electrodes disposed on the piezoelectric cantilevers to pick up voltages produced responsive to deformation of the cantilevers due to the impact of sound waves. As illustrated in FIG. 2A, the cantilever type PMM may include a circular shaped piezoelectric film divided into multiple pie-piece shaped cantilevers by trenches or cuts through the piezoelectric film. The electrodes may be disposed on the base sections of each of the cantilevers. As illustrated in FIG. 2B, the piezoelectric film may include two layers of piezoelectric material, with electrodes disposed on top of the upper film layer, between the upper and lower film layer, and on the bottom of the lower film layer. The different electrodes may be electrically connected in series to produce an output voltage responsive to deformation of the piezoelectric material film stack due to impact of sound waves.

Figure 3:
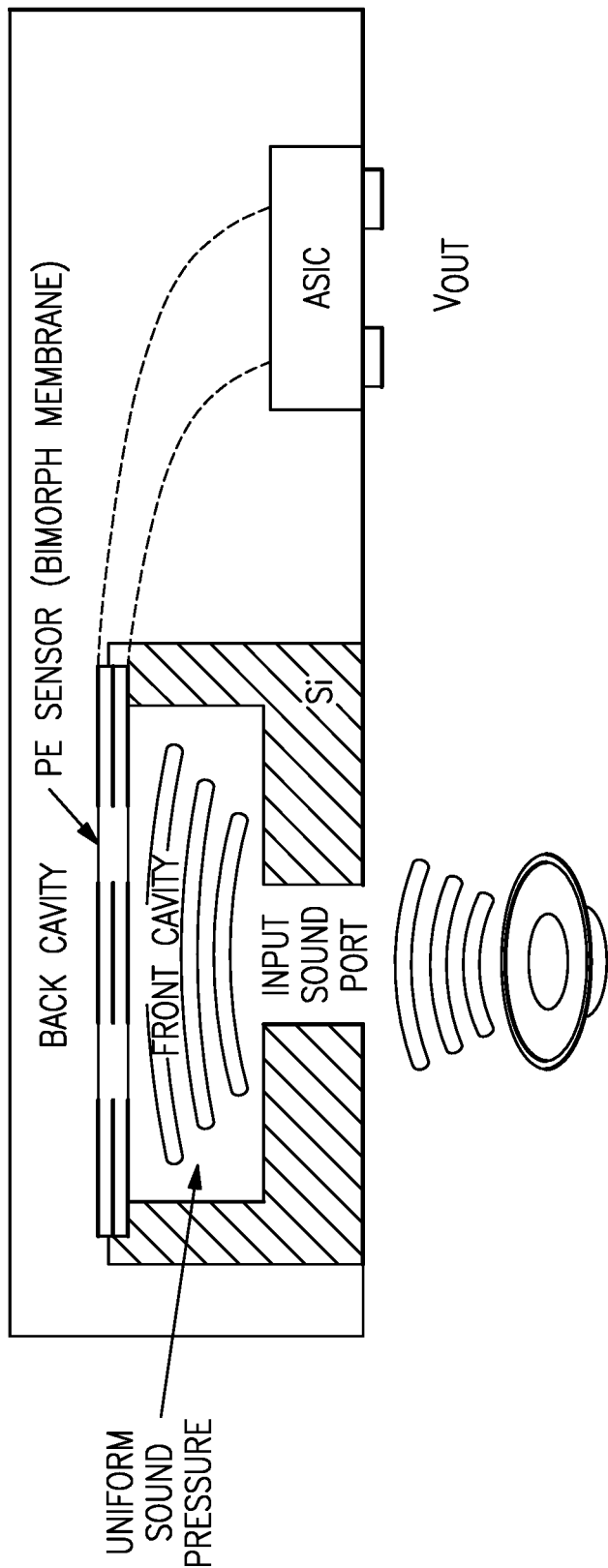
FIG. 3 illustrates an example of a packaged piezoelectric MEMS microphone.

A PMM may be packaged in a casing including the piezoelectric film mounted on a support substrate, often including an aperture or input port to allow sound to reach the piezoelectric film layer, along with electronics, for example, an application specific integrated circuit (ASIC)

for reading and amplifying voltages from the electrodes of the PMM and outputting a signal representative of sound detected by the PMM. One example is illustrated in FIG. 3.

Figure 4A:
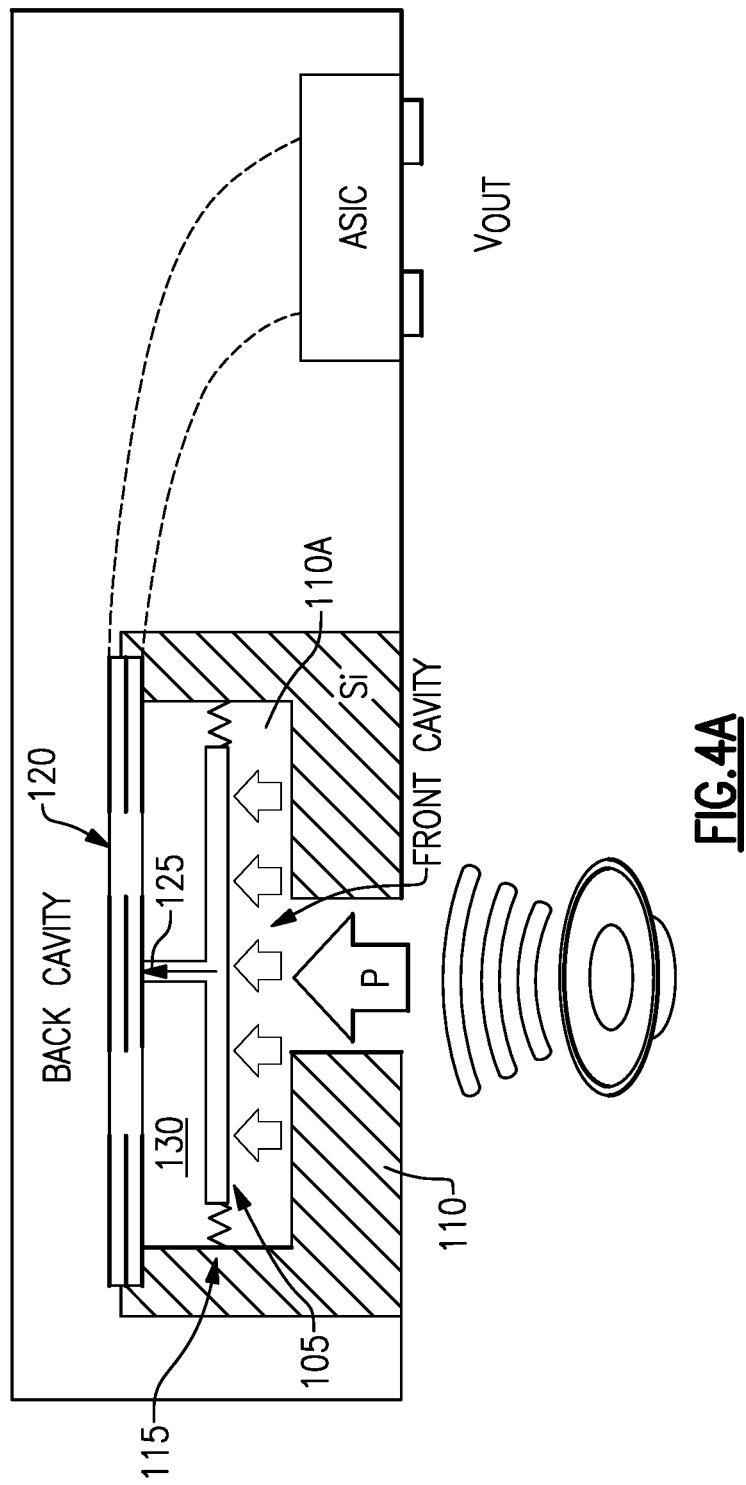
FIG. 4A illustrates another example of a packaged piezoelectric MEMS microphone.
Figure 5A:
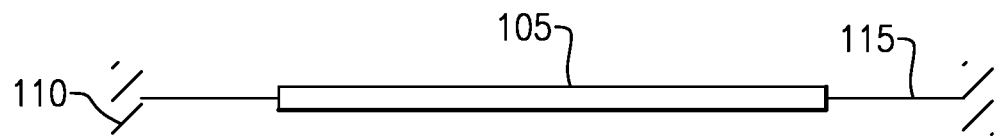
FIG. 5A illustrates different options for support structures for mounting a passive membrane in a housing of a packaged piezoelectric MEMS microphone.
Figure 5A:
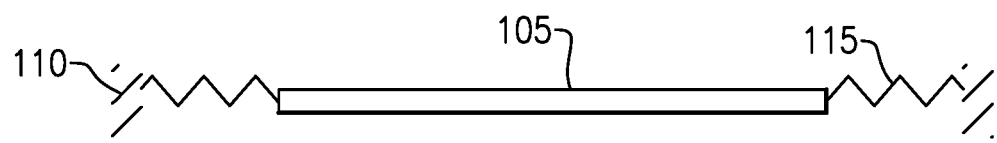
Figure 5A:
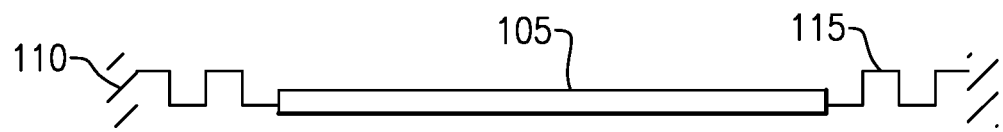
Figure 5B:
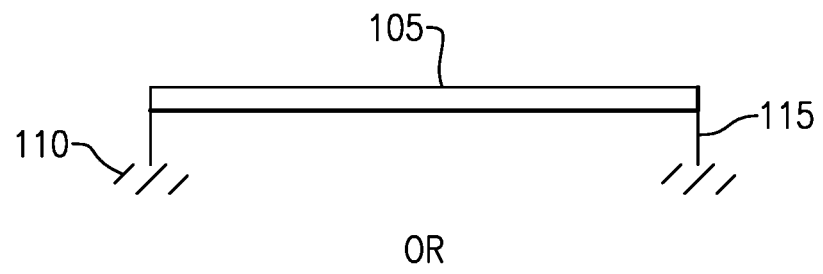
FIG. 5B illustrates additional options for support structures for mounting a passive membrane in a housing of a packaged piezoelectric MEMS microphone.
Figure 5B:
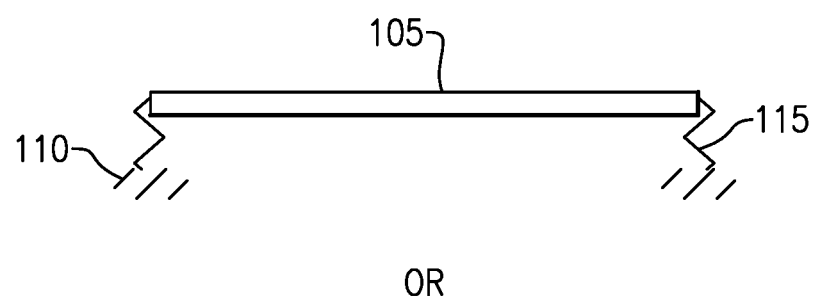
Figure 5B:
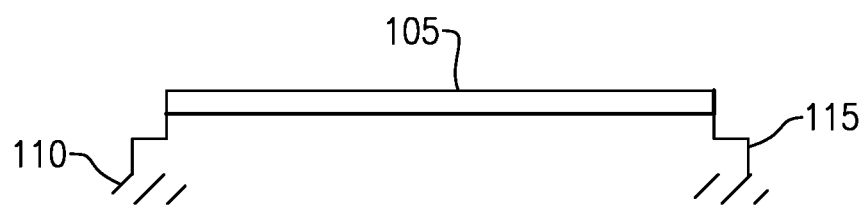
Figure 5C:
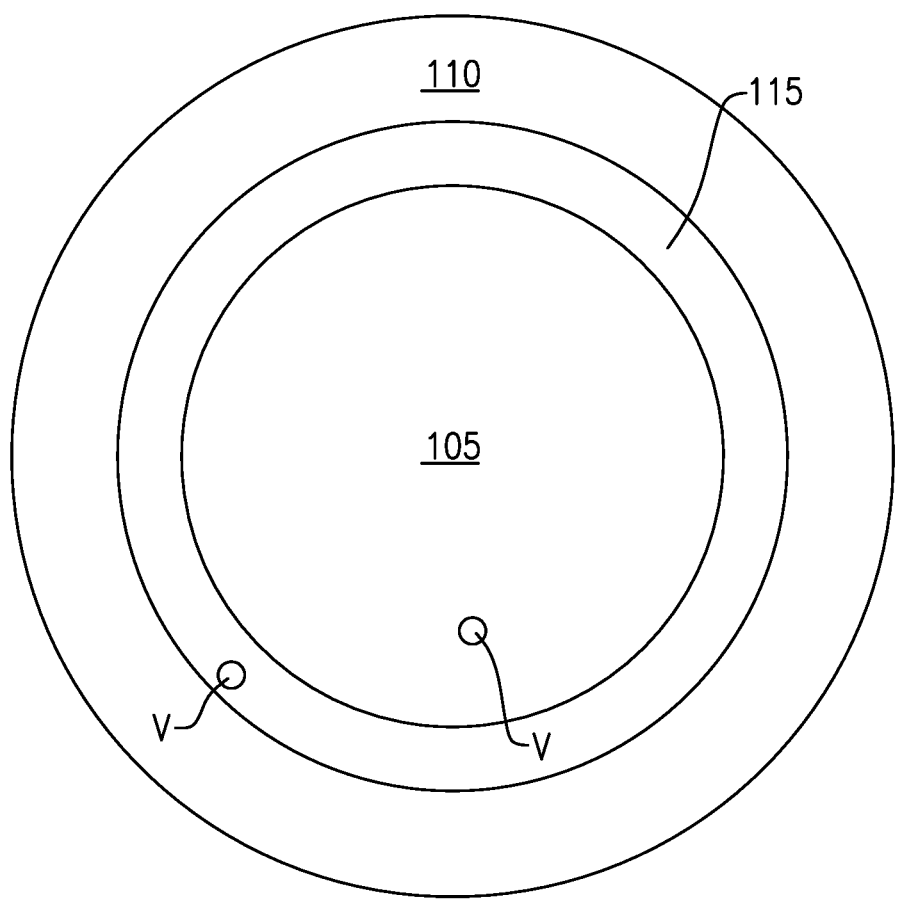
FIG. 5C illustrates possible locations for vent holes in a piezoelectric MEMS microphone structure.

It has been discovered that the sensitivity of a PMM may be increased by adding a passive (non-electrically active) membrane or plate between the acoustic input port of a PMM support structure and the piezoelectric membrane that is configured to enhance the force applied to a defined area of the piezoelectric membrane responsive to exposure to a given sound pressure. One example of this for a diaphragm structure PMM is illustrated in FIG. 4A. The structure of the packaged PMM in FIG. 4A differs from that of FIG. 3 in that the structure illustrated in FIG. 4A includes a passive membrane 105 coupled to an internal wall of the support structure 110 by high compliance supports 115, for example, micromechanical springs or corrugated strips of material, or a compliant material, for example, resin, silicone, or glue. The supports 115 may constrain the passive membrane 105 laterally, extending outward from the passive membrane in a direction defined by an upper or lower surface of the passive membrane 105 to portions of the housing 110 as illustrated in FIG. 5A, or may form anchors for the passive membrane, extending in a direction generally perpendicular to the direction defined by the upper or lower surface of the passive membrane 105 to portions of the housing 110 as illustrated in FIG. 5B. In some embodiments, as illustrated in FIG. 5C, one or more vent apertures V may be present in either the passive membrane 105 or the supports 115. These vent apertures may help reduce or eliminate a pressure differential between the environment external to the PMM and a region between the passive membrane 105 and the piezoelectric membrane 120 that might otherwise decrease performance of the PMM.

The passive membrane 105 has a greater stiffness or lesser compliance than the supports 115, and in some instances exhibits no detectable deformation when exposed to a maximum sound pressure for which the PMM is rated. The passive membrane 105 may be formed of a plate of a metal, for example, aluminum or an aluminum/tin alloy, a semiconductor, for example, silicon, or a dielectric, for example, silicon dioxide or silicon nitride. The passive membrane 105 may in some instances be formed of the same material as a material of the support structure 110, which may reduce manufacturing complexity. The passive membrane 105 is mechanically coupled to the piezoelectric membrane 120 by a column 125. A gap 130, in some embodiments filled with air, is present between the passive membrane 105 and the piezoelectric membrane 120. Depending on the material from which the passive membrane 105 is formed and the predicted bending of the passive membrane, the gap 130 may be very narrow, for example, about 1 μm or greater. The column 125 has a lesser cross-sectional area than the surface area of the surface of the passive membrane 105 that it extends from and a lesser cross-sectional area than the surface area of the surface of the piezoelectric membrane 120 that it extends to. The column 125 may extend from the center of the surface of the passive membrane 105 facing the piezoelectric membrane 120 to the center of the surface of the piezoelectric membrane 120 facing the passive membrane 105. Although illustrated as mechanically coupled to the inner electrode on the upper surface of the piezoelectric membrane 120, it is to be understood that the PMM may include a passivation layer on the upper surface piezoelectric membrane and electrodes as illustrated in FIG. 1B and the column 125 may be mechanically coupled to the passivation layer on top of the upper electrode rather to the upper electrode itself.

The passive membrane 105 desirably has a low mass to help avoid loss of sensitivity of the PMM at high frequencies, so the passive membrane 105 is desirably formed as thin as is practical while having sufficient stiffness and rigidity to avoid significant deflection when exposed to high pressure sound waves, for example, to exhibit deflection that is below detection limits or that avoids contact between the passive membrane 105 and other components of the packaged system when exposed to the highest sound pressure the device is rated for. A mass loading effect associated with the mass of the passive membrane may affect the resonance frequency of the PMM, wherein increased mass of the passive membrane may result in a reduced resonance frequency for the PMM. A reduced resonance frequency of the PMM may result in a reduced acoustic range for the PMM because the acoustic range may be limited on the high side by the resonant frequency of the PMM. Additionally, the sensitivity of a PMM may be reduced due to the addition of a stiff passive membrane—the total compliance of the mechanical system with the passive membrane in addition to the piezoelectric material membrane may be reduced and the sensitivity of the PMM decreased. To solve this problem, embodiments disclosed herein may utilize a highly compliant passive membrane support structure, which may render any adverse effects due to the presence of the stiff passive membrane negligible.

Figure 4B:
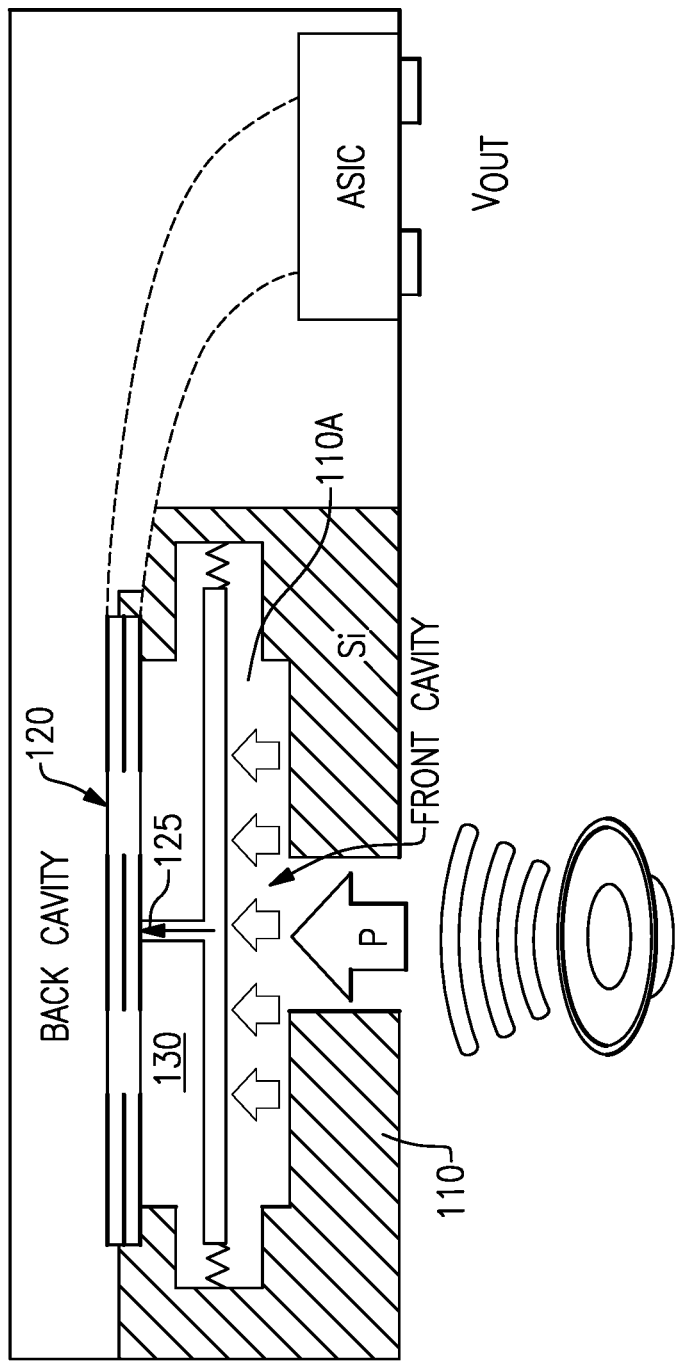
FIG. 4B illustrates another example of a packaged piezoelectric MEMS microphone.

In the example of FIG. 4A the passive membrane 105 has a lesser radius and cross-sectional area than the piezoelectric membrane 120 due to the presence of the supports 115. In other examples, the passive membrane 105 may be formed with a radius and cross-sectional area the same as or greater than that of the piezoelectric membrane 120 by, for example, enlarging the diameter of the front cavity 110A of the support structure 110 where the passive membrane 105 is joined to the support structure 110 by the supports 115. One example of this is illustrated in FIG. 4B where the passive membrane is coupled to the support substrate 110 by supports 115 within enlarged diameter portions or cavities defined in the internal wall of the support substrate.

A distance between the passive membrane 105 and the piezoelectric membrane 120 and/or surfaces of the support structure 110 facing surfaces of the passive membrane 105 may be greater than an expected displacement of the center of the surface of the piezoelectric membrane 120 when exposed to the greatest sound pressures the device is rated for. The center of the surface of the piezoelectric membrane 120 may be displaced by a distance on the order of nanometers when exposed to the greatest sound pressures the device is rated for, so a distance between the passive membrane 105 and the piezoelectric membrane 120 and/or surfaces of the support structure 110 facing surfaces of the passive membrane 105 may be at least a micron to provide a good safety margin against collision between the passive membrane 105 and piezoelectric membrane 120 and/or surfaces of the support structure 110. Accordingly, the column 125 may have a length of about a micron or more to maintain this distance between the passive membrane 105 and the piezoelectric membrane 120 and/or surfaces of the support structure 110 facing surfaces of the passive membrane 105.

Figure 6A:
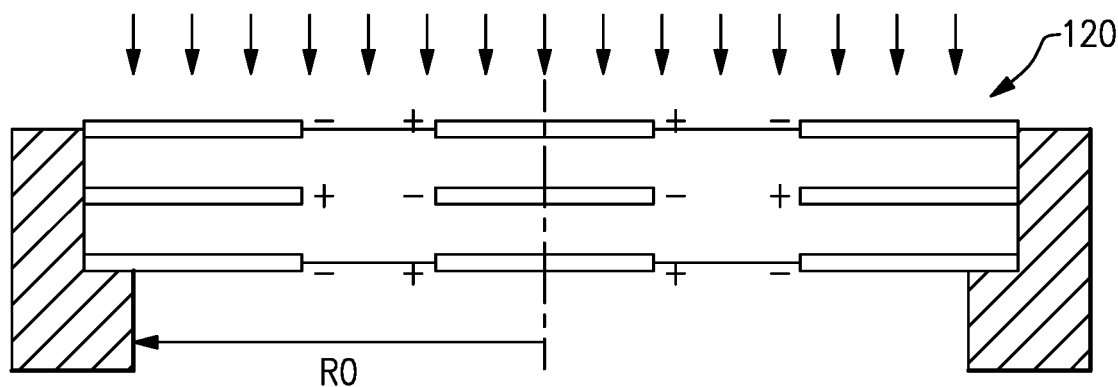
FIG. 6A illustrates a pressure distribution across a piezoelectric membrane of an example of a diaphragm type piezoelectric MEMS microphone due to sound applied to the diaphragm type piezoelectric MEMS microphone.
Figure 6B:
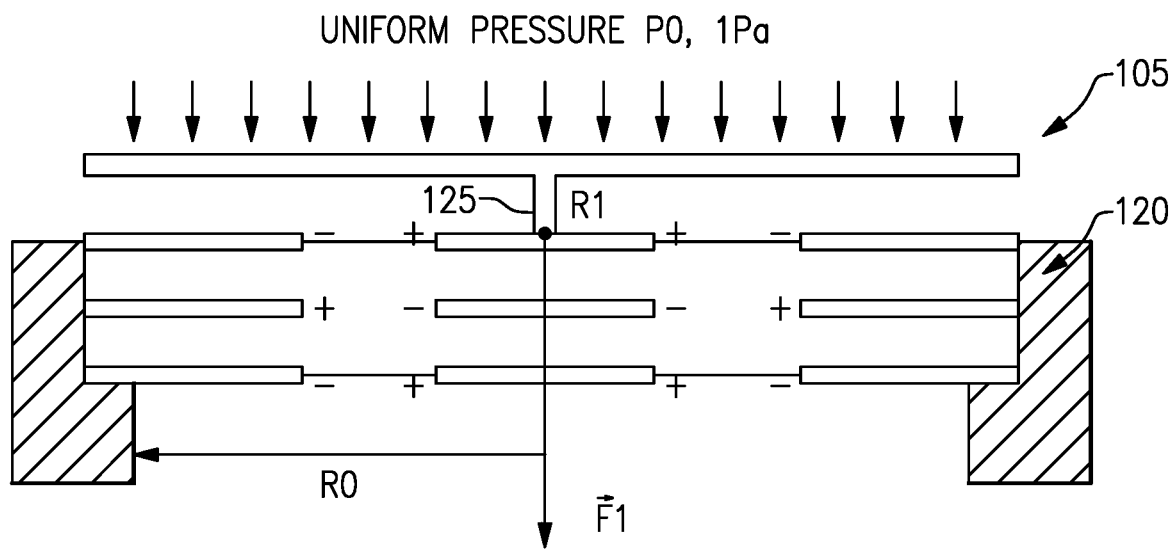
FIG. 6B illustrates a pressure distribution across a piezoelectric membrane of an example of a diaphragm type piezoelectric MEMS microphone including a passive membrane due to sound applied to the diaphragm type piezoelectric MEMS microphone.

A comparison between the pressures and forces exerted on the piezoelectric membrane of the structure illustrated in FIG. 3 compared to those exerted on the membrane of the structure illustrated in FIG. 4A is illustrated in FIGS. 6A and 6B. As shown in FIG. 6A, for the piezoelectric membrane of the structure illustrated in FIG. 3 without any passive membrane, sound waves impinging on the piezoelectric membrane 120 exert a uniform pressure $P_0$ across the entire surface of the membrane. This pressure causes a uniform force $F_0=P_0/A_0$ to be exerted across the entire membrane surface, where $A_0$ is the surface area of the piezoelectric membrane $\pi R_0^2$. In contrast, for the membrane of the structure illustrated in FIG. 4A, the uniform sound pressure $P_0$ is applied to the outer surface of the passive membrane 105 (the surface facing the acoustic port in a package for the PMM) and is transferred by the column 125 to the piezoelectric membrane 120. The pressure $P_1$ applied by the column 125 to the outer surface of the piezoelectric membrane 120 is multiplied by the ratio of the surface area ($A_0$ for an example in which the passive membrane 105 has the same surface area as the piezoelectric membrane 120) of the passive membrane 105 to the cross-sectional area of the column 125 ($A_1$). The cross-sectional area $A_1$ of the column 125 may be significantly smaller than the surface area $A_0$ of the passive membrane 105 so the pressure $P_1$ applied by the column 125 to the outer surface of the piezoelectric membrane 120 is significantly greater than the uniform pressure $P_0$ applied to the surface of the piezoelectric membrane of the structure illustrated in FIG. 3 for a given applied sound pressure. For example, if the piezoelectric membrane 120 has a diameter of about 1 mm, the column 125 may have a diameter of between about 10 μm and about 100 μm.

Figure 7A:
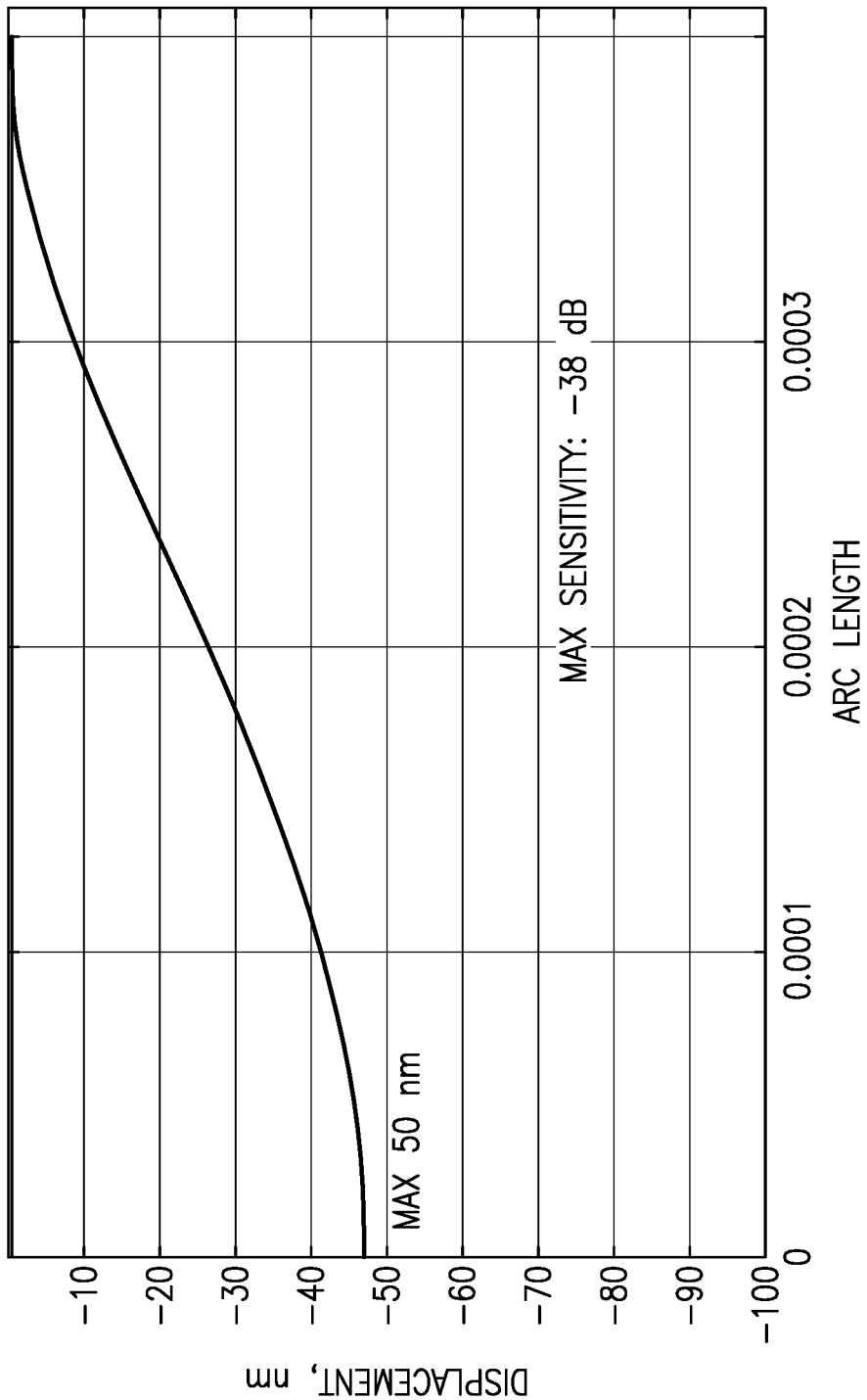
FIG. 7A is a chart of the results of a simulation of displacement of a piezoelectric membrane of an example of a diaphragm type piezoelectric MEMS microphone due to applied sound pressure.
Figure 7B:
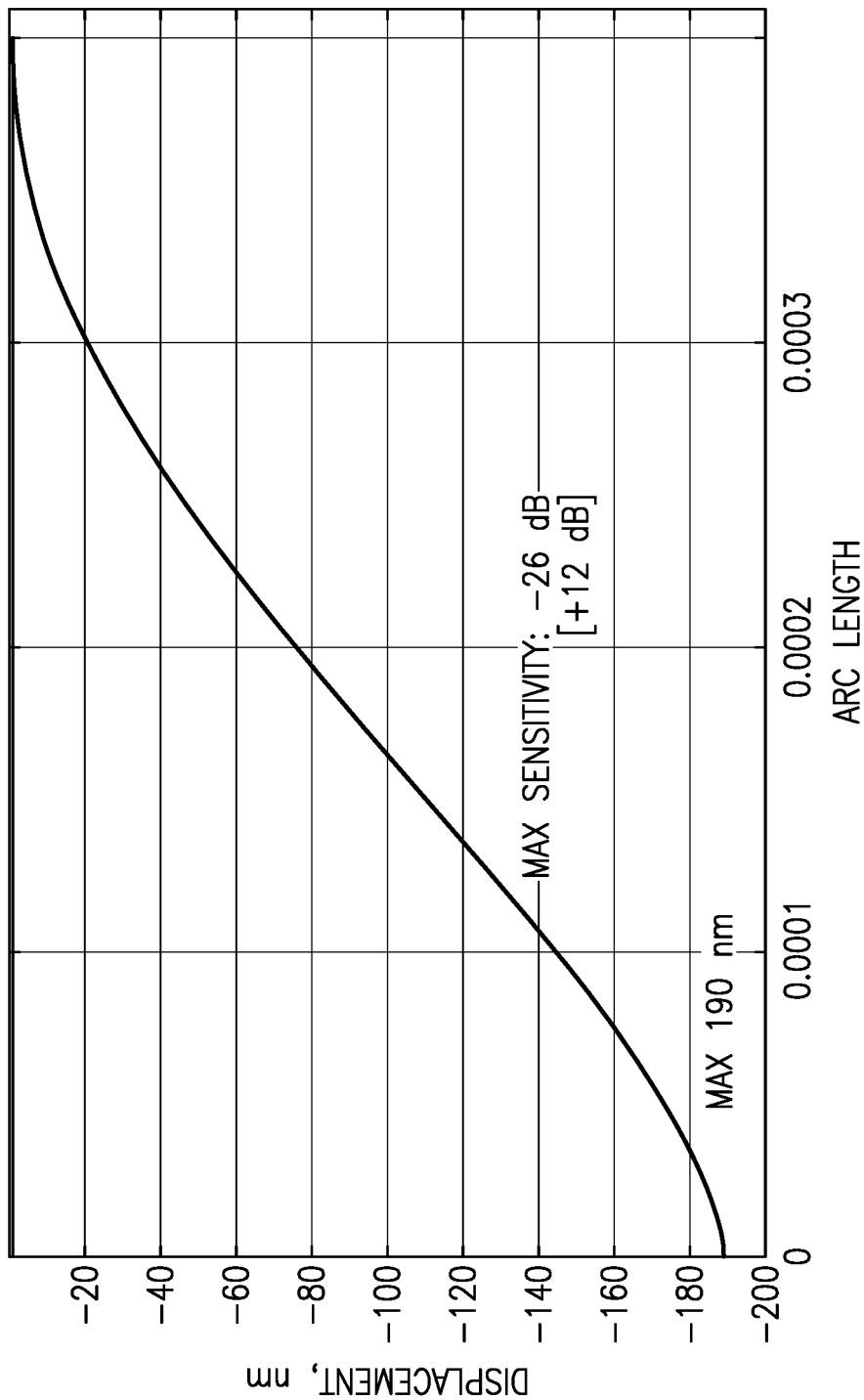
FIG. 7B is a chart of the results of a simulation of displacement of a piezoelectric membrane of an example of a diaphragm type piezoelectric MEMS microphone including a passive membrane due to applied sound pressure.

The effect of the increased pressure applied to the center of the surface of the piezoelectric membrane of the structure of FIG. 4A including the passive membrane on displacement of the piezoelectric membrane compared to the displacement of the piezoelectric membrane of the structure of FIG. 3 lacking the passive membrane is illustrated in FIGS. 7A and 7B. FIG. 7A illustrates the results of simulation of displacement of the piezoelectric membrane of the structure of FIG. 3 without the passive membrane responsive to application of a sound pressure of 1 Pa. FIG. 7B illustrates the results of simulation of displacement of the piezoelectric membrane of the structure of FIG. 4A with the passive membrane and column responsive to application of a sound pressure of 1 Pa. The simulation was performed with a simulated column diameter of 1 μm. In the charts of FIGS. 7A and 7B, the Y axis represents piezoelectric membrane displacement in nm and the X axis "Arc length" parameter represents distance from the along the surface of the membrane from the center of the surface of the membrane in meters, the zero arc length point being at the center of the membrane. The displacement of the piezoelectric membrane of the structure of FIG. 3 reached a maximum of 50 nm at the center of the piezoelectric membrane, corresponding to a sensitivity of −38 dB, while the displacement of the piezoelectric membrane of the structure of FIG. 4A reached a maximum of 190 nm at the center of the piezoelectric membrane, corresponding to a sensitivity of −26 dB, a 12 dB improvement over the sensitivity of the piezoelectric membrane of the structure of FIG. 3. It is to be understood that the achieved improvement in sensitivity depends on sensor structure, electrode optimization, and piezoelectric martial. The potential sensitivity improvement in other embodiments may be higher than 20 dB for the same simulated sensor size and over 20 dB if a larger passive membrane than simulated was utilized.

Figure 8A:
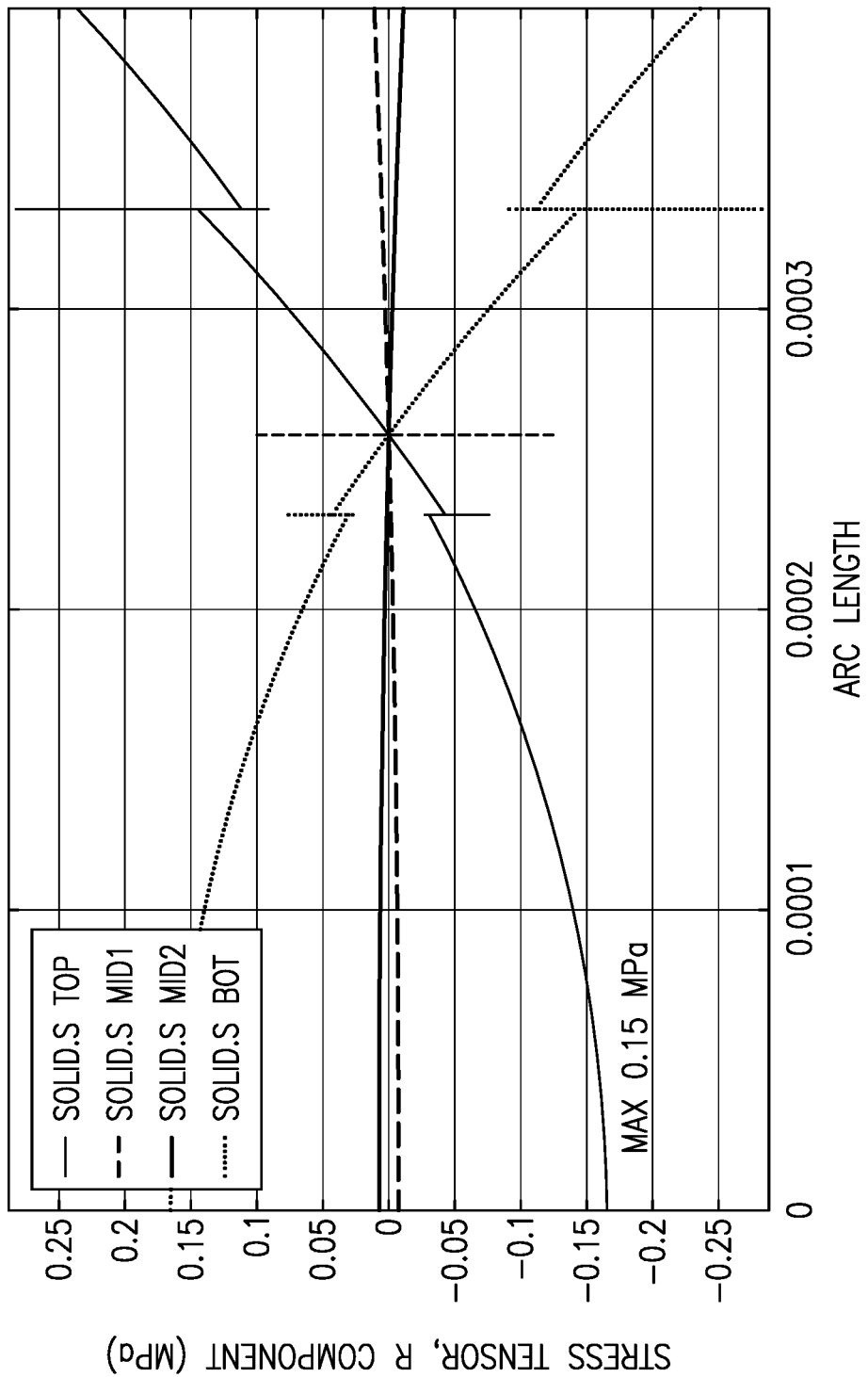
FIG. 8A is a chart of the results of a simulation of stress distribution across a piezoelectric membrane of an example of a diaphragm type piezoelectric MEMS microphone due to applied sound pressure.
Figure 8B:
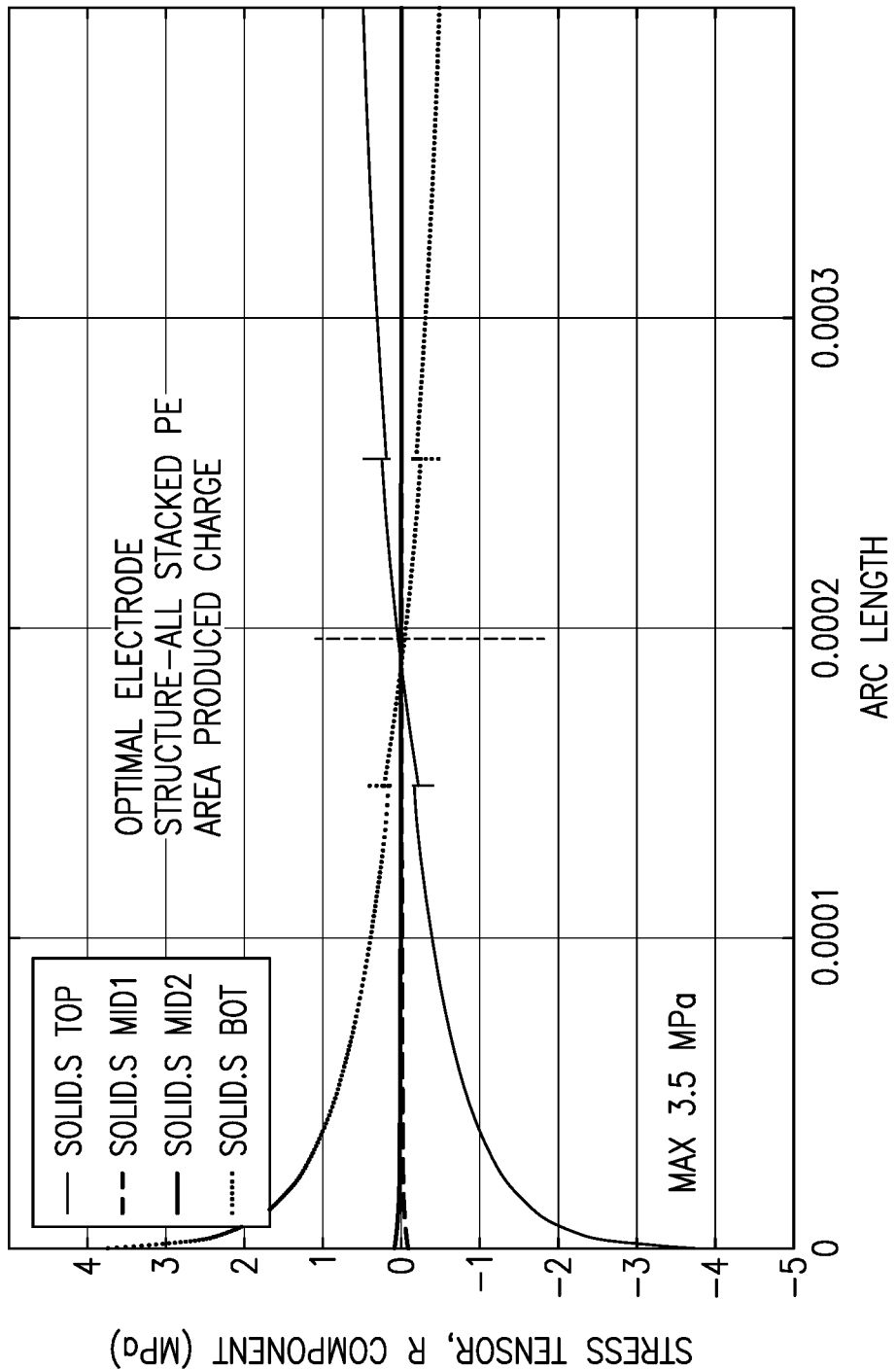
FIG. 8B is a chart of the results of a simulation of stress distribution across a piezoelectric membrane of an example of a diaphragm type piezoelectric MEMS microphone including a passive membrane due to applied sound pressure.

The effect of the increased pressure applied to the center of the surface of the piezoelectric membrane of the structure of FIG. 4A including the passive membrane on stress distribution across the piezoelectric membrane compared to the stress distribution across the piezoelectric membrane of the structure of FIG. 3 lacking the passive membrane is illustrated in FIGS. 8A and 8B. FIG. 8A illustrates the results of simulation of stress distribution across the piezoelectric membrane of the structure of FIG. 3 without the passive membrane responsive to application of a sound pressure of 1 Pa. FIG. 8B illustrates the results of simulation of stress distribution across the piezoelectric membrane of the structure of FIG. 4A with the passive membrane and column responsive to application of a sound pressure of 1 Pa, with a simulated column diameter of 1 μm. In the charts of FIGS. 8A and 8B, the Y axis represents the stress tensor at different positions across the piezoelectric membrane in MPa and the X axis "Arc length" parameter represents distance from the along the surface of the membrane from the center of the surface of the membrane in meters. The "solid.s Top" curve represents stress across the upper surface of the upper piezoelectric film. The "solid.s Mid1" curve represents stress across a midline of the upper piezoelectric film. The "solid.s Mid2" curve represents stress across a midline of the lower piezoelectric film. The "solid.s Bot" curve represents stress across the lower surface of the lower piezoelectric film. Discontinuities in the curves in the charts of FIGS. 8A and 8B correspond to locations of edges of the electrodes disposed on the membranes of the corresponding PMM structures. The discontinuities in the curves of FIG. 8B differ from the location of the discontinuities in the curves of FIG. 8A because optimization of electrode location was simulated for the structure of FIG. 4A, from which the simulated results illustrated in FIG. 8B are illustrated.

Comparing the charts of FIGS. 8A and 8B, it can be seen that a significantly greater stress of 3.5 MPa was exhibited in the top and bottom surfaces at the center of the piezoelectric film of the structure of FIG. 4A including the passive membrane than the maximum stress of 0.15 MPA exhibited at the top and bottom surfaces of the center of the piezoelectric film of the structure of FIG. 3. A greater stress corresponds to a greater amount of charge distribution and voltage generated in the piezoelectric membrane as a result of deformation of the membrane and a greater sensitivity. The charts of FIGS. 8A and 8B thus confirm that the sensitivity of the structure of FIG. 4A including the passive membrane is significantly greater than the sensitivity of the structure of FIG. 3 lacking the passive membrane.

The charts of FIGS. 8A and 8B also show a significantly greater stress being generated in areas proximate the center of the piezoelectric membrane than in areas closer to the perimeter of the piezoelectric membrane. Regions of higher stress in the piezoelectric membrane produce higher charge than regions with lower stress. The results of the simulations illustrated I FIGS. 8A and 8B thus indicate that the outer electrodes may contribute significantly less to the total output signal (voltage) of the PMM structures than the inner electrodes. Accordingly, in some embodiments, the outer electrodes may be omitted from the PMM structure. Removal of the outer electrodes may decrease overall capacitance and of the electrode structures and decrease the mass loading of the piezoelectric membrane which may provide for improved performance of the PMM devices, for example, by increasing the resonance frequency and sensitivity, especially at higher frequencies.

Figure 9:
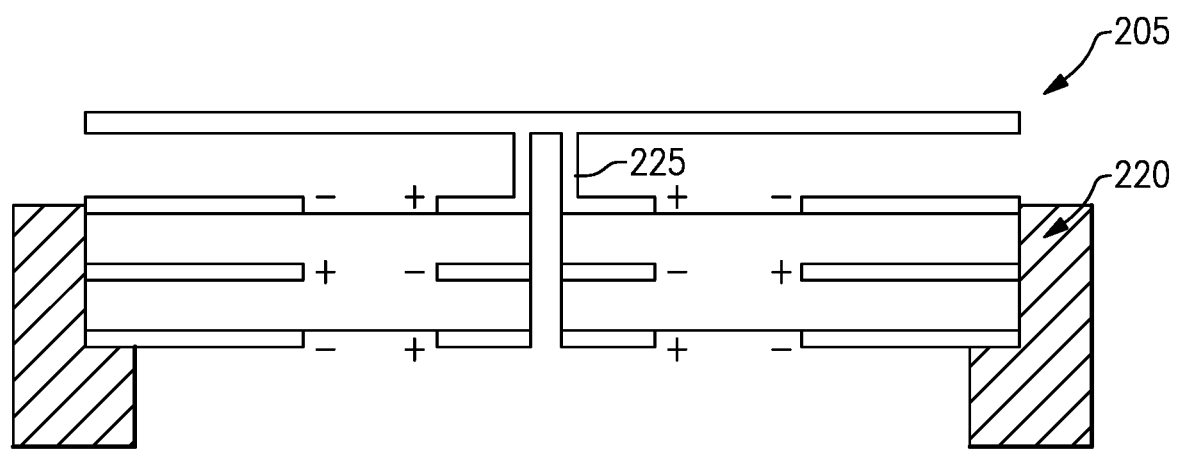
FIG. 9 is a cross section of an example of a cantilever type piezoelectric MEMS microphone including a passive membrane.

The structures and methods described above for increasing the sensitivity of a diaphragm type PMM may also be applied to increase the sensitivity of a cantilever type PMM. FIG. 9 illustrates a cross-section of a cantilever type PMM including a passive membrane 205 coupled to the cantilevers 220 of the cantilever type PMM by columns 225. The passive membrane 205 may be attached to the free ends or proximate the free ends of each of the cantilevers, or a subset of the cantilevers, of the cantilever type PMM by at least one column 225 per cantilever. The columns 225 may have a combined cross-sectional area that is less than a combined surface area of the cantilevers 220 and less than a surface area of the passive membrane 205.

Although illustrated as mechanically coupled to the inner electrodes of cantilevers of the cantilever PMM, it is to be understood that the cantilever PMM may include a passivation layer on the upper surface piezoelectric membrane cantilevers and electrodes as illustrated in FIG. 2B and the columns 225 may be mechanically coupled to the passivation layer on top of the electrodes rather to the electrodes themselves.

The discussion above of the materials, dimensions, and other parameters of the passive membrane 105, column 125, and piezoelectric membrane 120, and housing of the diaphragm type PMM above may apply equally to examples of a cantilever type PMM including a passive membrane 205.

In addition to increasing the sensitivity of a PMM as disclosed herein, a passive membrane may also increase the reliability of a PMM. The passive membrane may be placed between the piezoelectric membrane and an acoustic port of a package of the PMM. The passive membrane may block potentially damaging substances, for example, moisture, dust, or other particulate matter from entering the acoustic port and reaching the piezoelectric membrane where these substances might otherwise degrade the piezoelectric material of the membrane or the material of the electrodes, short out the electrodes, or add weight to the piezoelectric membrane that might degrade its frequency response.

Figure 10:
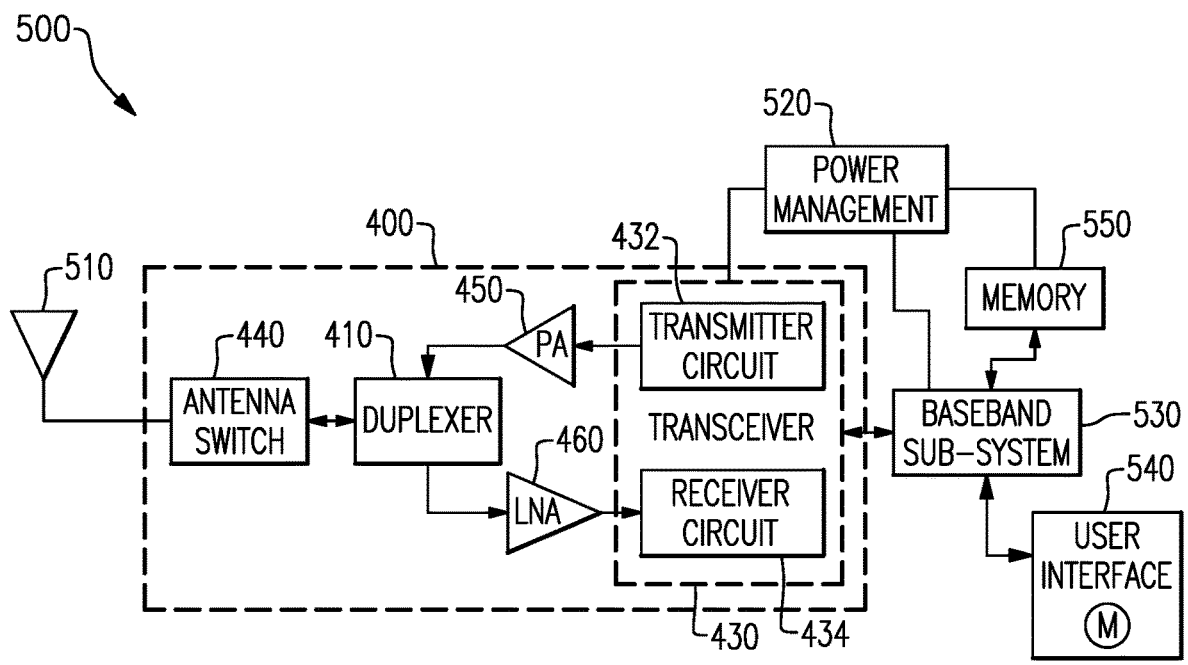
FIG. 10 is a block diagram of one example of a wireless device including a piezoelectric MEMS microphone including a passive membrane.

Examples of MEMS microphones as disclosed herein can be implemented in a variety of packaged modules and devices. FIG. 10 is a schematic block diagrams of an illustrative device 500 according to certain embodiments.

The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400. The front-end module 400 includes an antenna duplexer 410 an antenna switch 440, which can be configured to switch between different frequency bands or modes, such as transmit and receive modes, for example. An antenna 510 is connected to the antenna switch 440. In the example illustrated in FIG. 10, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 further includes a transmitter circuit 432 connected to the duplexer 410 and a receiver circuit 434 connected to the duplexer 410. The transmitter circuit 432 may generate signals for transmission via the antenna 510, and the receiver circuit 434 can receive and process signals received via the antenna 510. In some embodiments, the receiver and transmitter circuits are implemented as separate components, as shown in FIG. 10, however, in other embodiments these components may be integrated into a common transceiver circuit or module. As will be appreciated by those skilled in the art, the front-end module 400 may include other components that are not illustrated in FIG. 10 including, but not limited to, switches, electromagnetic couplers, amplifiers, processors, and the like.

The front-end module 400 includes a transceiver 430 that is configured to generate signals for transmission or to process received signals. The transceiver 430 can include the transmitter circuit 432, which can be connected to an input node of the duplexer 410, and the receiver circuit 434, which can be connected to an output node of the duplexer 410.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 10, the front-end module 400 may further include a low noise amplifier module 460, which amplifies received signals from the antenna 510 and provides the amplified signals to the receiver circuit 434 of the transceiver 430.

The wireless device 500 of FIG. 10 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The user interface 540 may include a microphone M, which may be an embodiment of a PMM as disclosed herein. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets.

The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 10 GHz, such as in the X or Ku 5G frequency bands.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways.

Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A piezoelectric microelectromechanical system microphone comprising:
   a supporting substrate;
   a cavity defined in the supporting substrate;
   a piezoelectric element having a diaphragm structure clamped to the supporting substrate about its perimeter and extending across an entire width of the cavity, the piezoelectric element including an upper film of piezoelectric material and a lower film of piezoelectric material, an upper sensing electrode disposed on an upper surface of the upper film, a lower sensing electrode disposed on a lower surface of the lower film, and a middle sensing electrode disposed between the upper film and lower film, the piezoelectric element configured to deform and generate an electrical potential responsive to impingement of sound waves on the piezoelectric microelectromechanical system microphone;
   a sensing electrode disposed on the piezoelectric element and configured to sense the electrical potential; and
   a passive membrane mechanically coupled to a surface of the piezoelectric element.

2. The piezoelectric microelectromechanical system microphone of claim 1 wherein the passive membrane is mechanically coupled to the surface of the piezoelectric element by a column having a cross-sectional area that is less than a surface area of the piezoelectric element and less than a surface area of the passive membrane.

3. The piezoelectric microelectromechanical system microphone of claim 1 wherein the column has a length of at least one micron.

4. The piezoelectric microelectromechanical system microphone of claim 1 wherein the supporting substrate includes an acoustic port and the passive membrane is mechanically secured to the supporting substrate between the piezoelectric element and the acoustic port.

5. The piezoelectric microelectromechanical system microphone of claim 4 further comprising one or more vent apertures defined in a support mechanically securing the passive membrane to the supporting substrate.

6. The piezoelectric microelectromechanical system microphone of claim 4 wherein the passive membrane is mechanically secured to the supporting substrate with a micromechanical spring.

7. The piezoelectric microelectromechanical system microphone of claim 4 wherein the passive membrane is mechanically secured to the supporting substrate with a material having a greater compliance than a material of which the passive membrane is formed.

8. The piezoelectric microelectromechanical system microphone of claim 1 wherein the passive membrane has a surface area that is less than a surface area of the piezoelectric element.

9. The piezoelectric microelectromechanical system microphone of claim 1 wherein the passive membrane has a surface area that is about the same as a surface area of the piezoelectric element.

10. The piezoelectric microelectromechanical system microphone of claim 1 wherein the passive membrane has a surface area that is greater than a surface area of the piezoelectric element.

11. The piezoelectric microelectromechanical system microphone of claim 10 wherein the passive membrane is mechanically secured to the supporting substrate in an enlarged diameter region of the supporting substrate.

12. The piezoelectric microelectromechanical system microphone of claim 1 wherein the passive membrane is mechanically coupled to the surface of the piezoelectric element by a column extending from a center of a surface of the passive membrane to a center of the surface of the piezoelectric element.

13. The piezoelectric microelectromechanical system microphone of claim 1 wherein the sensing electrode includes both inner electrode regions proximate a center region of the piezoelectric element and outer electrodes proximate the perimeter of the piezoelectric element.

14. The piezoelectric microelectromechanical system microphone of claim 1 wherein the sensing electrode includes inner electrode regions proximate a center region of the piezoelectric element but lacks outer electrodes proximate the perimeter of the piezoelectric element.

15. The piezoelectric microelectromechanical system microphone of claim 1 further comprising one or more vent apertures defined in the passive membrane.

16. The piezoelectric microelectromechanical system microphone of claim 1 included in an electronic device.

17. The piezoelectric microelectromechanical system microphone of claim 2 wherein the column is directly coupled to the sensing electrode.

\* \* \* \* \*